United States Patent
Cohen et al.

(10) Patent No.: US 6,313,042 B1
(45) Date of Patent: *Nov. 6, 2001

(54) CLEANING CONTACT WITH SUCCESSIVE FLUORINE AND HYDROGEN PLASMAS

(75) Inventors: Barney M. Cohen, Santa Clara; Jingang Su, Sunnyvale; Kenny King-Tai Ngan, Fremont; Jr-Jyan Chen, Santa Clara, all of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,135

(22) Filed: Sep. 3, 1999

(51) Int. Cl.[7] .................. H01L 21/302; H01L 21/461; H01L 21/44
(52) U.S. Cl. .................. 438/734; 438/706; 438/906; 438/655; 438/656; 438/664
(58) Field of Search .................. 438/734, 721, 438/720, 719, 974, 648, 649, 655, 656, 660, 661, 664, 706, 707, 710, 726, 729, 906

(56) References Cited

U.S. PATENT DOCUMENTS

| | | | |
|---|---|---|---|
| 4,851,295 | * 7/1989 | Brors | 428/450 |
| 5,100,504 | * 3/1992 | Kawai et al. | 156/643 |
| 5,306,671 | * 4/1994 | Ogawa et al. | 438/595 |
| 5,627,105 | * 5/1997 | Delfino et al. | 438/627 |
| 5,770,263 | 6/1998 | Hawthorne et al. | 427/309 |
| 5,834,367 | * 10/1998 | Otsuka et al. | 438/618 |
| 5,968,279 | 10/1999 | MacLeish et al. | 134/1.2 |
| 6,029,680 | 2/2000 | Hawthorne et al. | 134/1.3 |

\* cited by examiner

Primary Examiner—Tuan H. Nguyen
Assistant Examiner—Thanhha Pham
(74) Attorney, Agent, or Firm—Thomason, Moser & Patterson

(57) ABSTRACT

A method of cleaning a contact area of a semiconductor or metal region on a substrate of an electronic device. First, the contact area is cleaned by exposing the substrate to a plasma that includes fluorine-containing species. Second, the substrate is exposed to a second atmosphere that scavenges fluorine, preferably formed by plasma decomposition of a hydrogen-containing gas. The second atmosphere removes any fluorine residue remaining on the contact area and overcomes any need to include argon sputtering in the cleaning process. Another aspect of the invention is a method of depositing a refractory metal over a contact area of a semiconductor region on a substrate. The contact area is cleaned according to the two-step process of the preceding paragraph. Then a refractory metal is deposited over the contact area. The two-step cleaning process can reduce the electrical resistance between the refractory metal and the semiconductor region. Furthermore, if the substrate is annealed to interdiffuse atoms of the semiconductor material and the refractory metal, the two-step cleaning process can reduce the anneal temperature required to achieve a desired low electrical resistance.

20 Claims, 4 Drawing Sheets

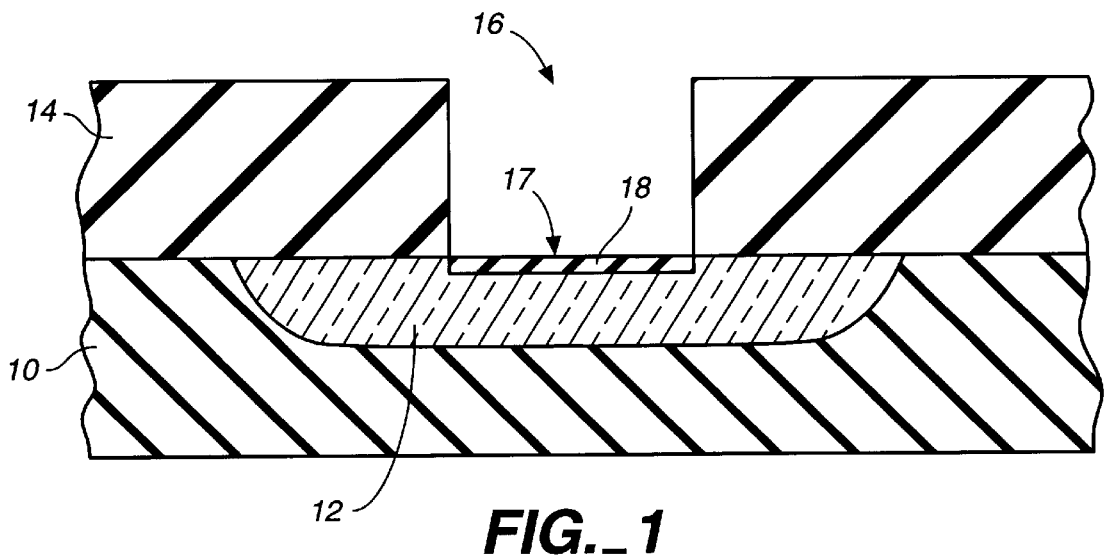
FIG._1
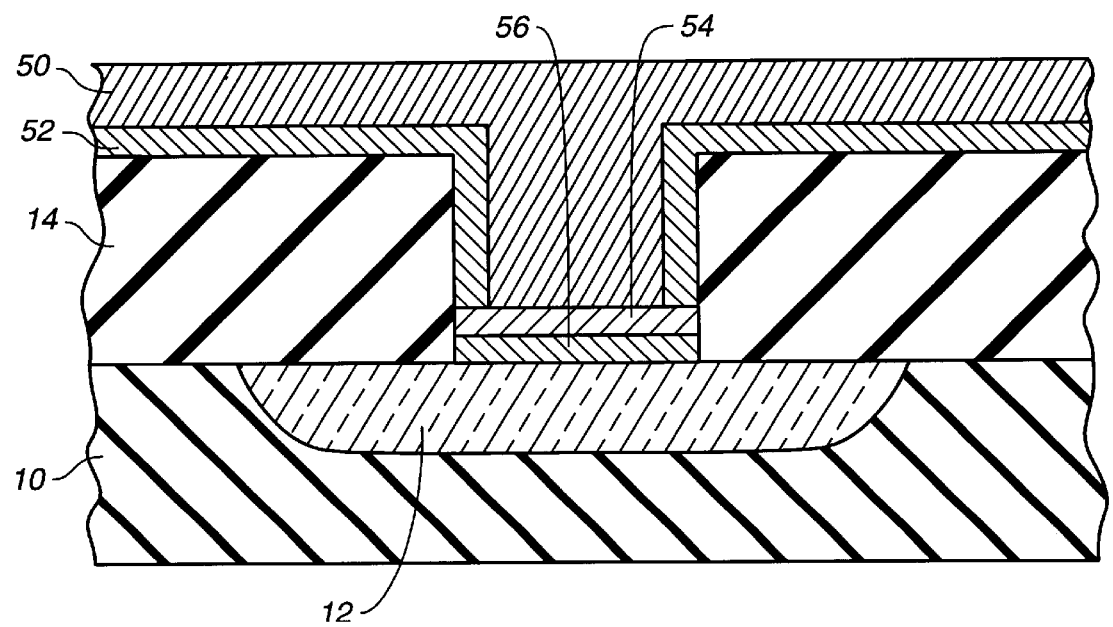
FIG._4

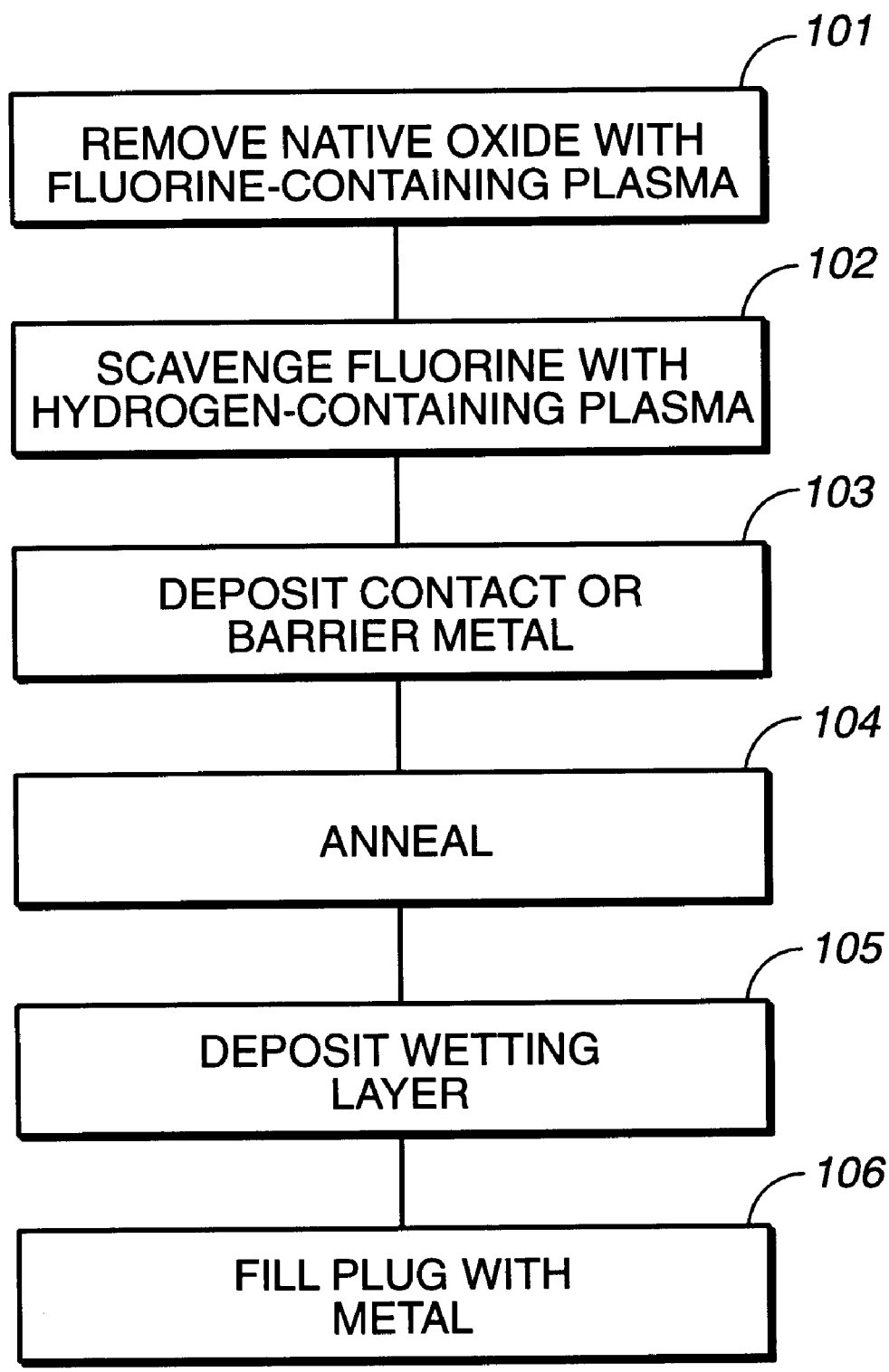
FIG._2

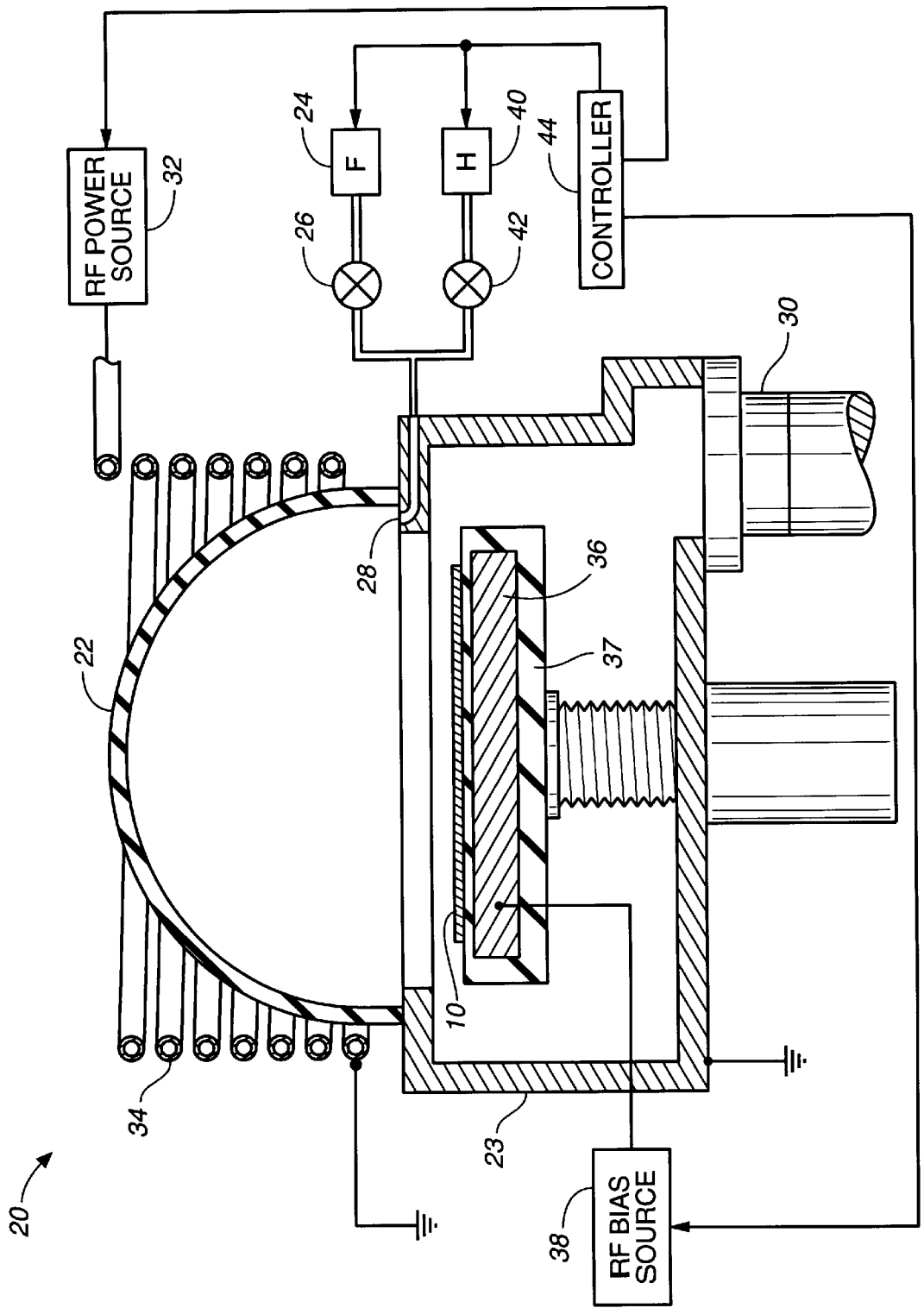
FIG._3

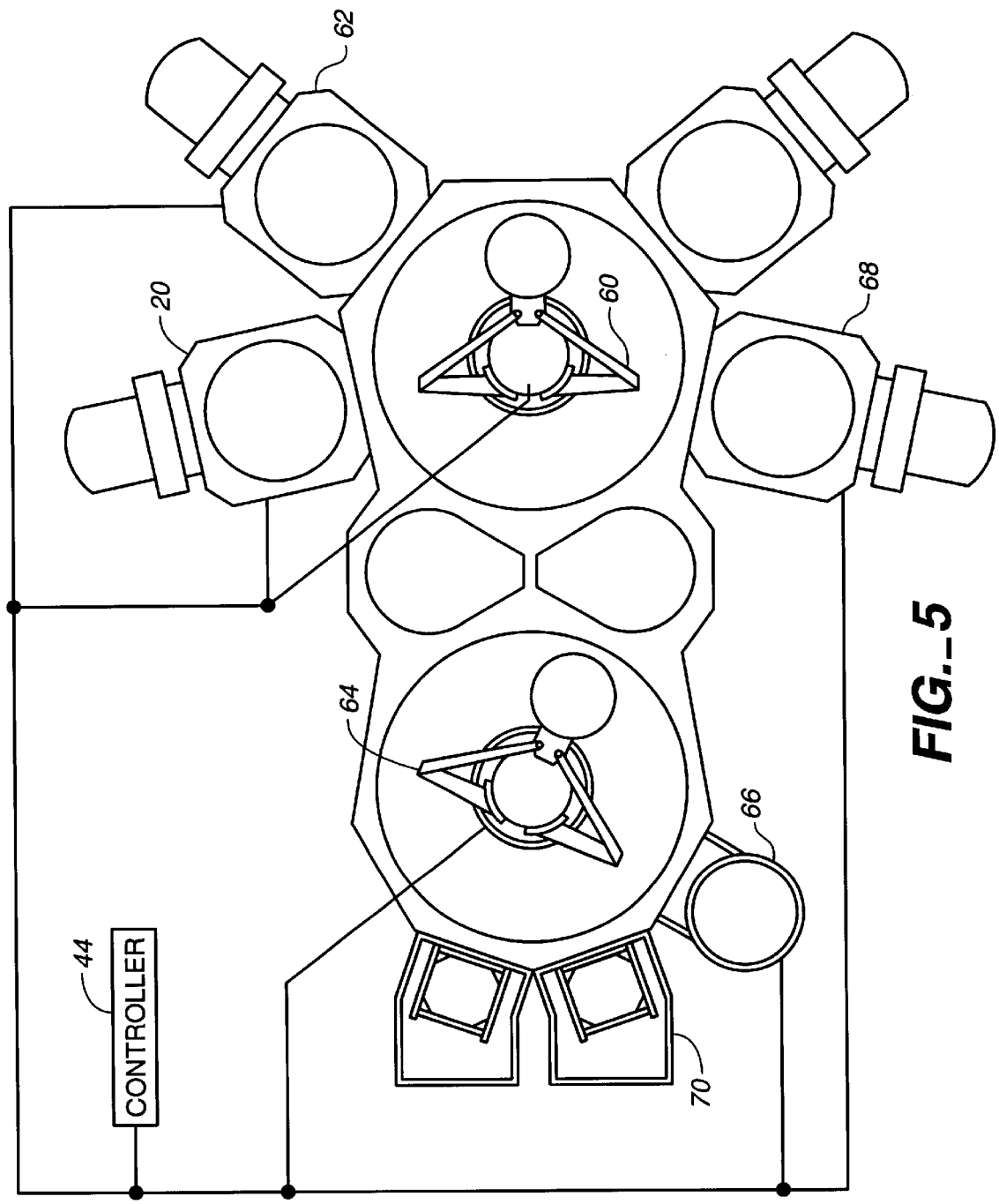
FIG._5

CLEANING CONTACT WITH SUCCESSIVE FLUORINE AND HYDROGEN PLASMAS

FIELD OF THE INVENTION

The invention relates generally to methods of removing native oxide from a contact area on a semiconductor or metal layer before depositing a metal plug over the area. More specifically, the invention relates to such a method including a step of cleaning the contact area using a fluorine-containing plasma, followed by a step of removing any fluorine residue by exposing the contact area to a hydrogen-containing plasma.

BACKGROUND OF THE INVENTION

A common process sequence in manufacturing integrated circuits and other electronic devices is to deposit a dielectric layer over a semiconductor or metal region on a substrate, then etch a number of openings in the dielectric so that each opening exposes a contact area on the semiconductor or metal region, then deposit a metal plug in each opening so as to make electrical contact with the contact area. If the substrate is exposed to the ambient atmosphere or any other source of oxygen after the openings are formed, the surface of the semiconductor or metal layer exposed in each opening will become oxidized. This native oxide must be removed or "cleaned" before depositing the metal plug in order to achieve good electrical contact between the plug and the contact area.

One conventional method of cleaning native oxide from a silicon layer before depositing a tungsten plug is plasma cleaning with a mixture of argon and $NF_3$, as described in commonly assigned U.S. Pat. No. 5,043,299 issued to Chang et al. on Aug 27, 1991. However, because this cleaning process includes argon, it is unsuitable for certain dielectrics or shallow semiconductor junctions which can be damaged by argon sputtering.

Another problem exists when the contact area is on a semiconductor region such as silicon. In order to make good electrical contact between a metal plug and the semiconductor region, it typically is necessary to deposit over the contact area a layer of refractory metal, and then anneal the workpiece so that atoms of the semiconductor material and the refractory metal interdiffuse to form a compound such as, when the semiconductor is silicon, a refractory metal silicide. The anneal temperatures required to achieve a low resistance electrical contact typically are high enough to produce undesirable diffusion of the refractory metal into the semiconductor layer or the dielectric.

SUMMARY OF THE INVENTION

The invention is a method of cleaning a contact area of a semiconductor or metal region on a substrate of an electronic device. First, the contact area is cleaned by exposing the substrate to a first atmosphere formed by plasma decomposition of at least one fluorine-containing gas. Second, the substrate is exposed to a second atmosphere that scavenges fluorine. The second atmosphere preferably is formed by plasma decomposition of at least one hydrogen-containing gas. The second atmosphere removes any fluorine residue remaining on the contact area and overcomes any need to include argon sputtering in the cleaning process.

Another aspect of the invention is a method of depositing a refractory metal over a contact area of a semiconductor region on a substrate. The contact area is cleaned according to the two-step process of the preceding paragraph. Then a refractory metal is deposited over the contact area. We have discovered that our two-step cleaning process can reduce the electrical resistance between the refractory metal and the semiconductor region. Furthermore, if the substrate is annealed to interdiffuse atoms of the semiconductor material and the refractory metal, we have discovered that our two-step cleaning process can reduce the anneal temperature required to achieve a desired low electrical resistance.

BRIEF DESCRIPTION OF THE DRAWINGS

FIG. 1 is a sectional view of a substrate on which the processes of the invention may be performed.

FIG. 2 is a flow chart of a preclean and metal deposition process according to our invention.

FIG. 3 is a partially schematic, sectional view of a plasma chamber suitable for performing the cleaning processes of the invention.

FIG. 4 is a sectional view of a substrate on which a metal plug has been deposited over an exposed contact area of a silicon region.

FIG. 5 is a partially schematic, top view of a multi-chamber system for performing cleaning and metal deposition.

DETAILED DESCRIPTION OF THE PREFERRED EMBODIMENTS

FIG. 1 shows a conventional semiconductor workpiece or substrate 10 on which the processes of the invention may be performed. The substrate typically is a silicon wafer on which integrated circuits are to be formed or a glass substrate on which electronic video display devices and circuits are to be formed. The substrate is depicted as a silicon wafer in all of the following examples.

The substrate includes one or more regions 12 of semiconductor or metal material. A dielectric layer 14 overlies the semiconductor or metal regions. The dielectric 14 is patterned with a number of openings 16 so that each opening exposes an area 17 of one of the semiconductor or metal regions 12, this area 17 being termed the "contact area" or "exposed area" of the semiconductor or metal region. (We define all portions of the semiconductor or metal regions 12 that are not covered by the dielectric 14 as being "exposed" even though the exposed surface may be covered by thin layer of native oxide as a result of exposure of the metal to oxygen, such as oxygen in the ambient atmosphere.)

Typically each opening is filled with a metal material to form a "plug" that makes electrical contact with the underlying semiconductor or metal region 12. The plug also is called a "contact" or "via" according to whether the underlying region 12 is a semiconductor region or a metal interconnect, respectively.

Both the illustrated workpiece and the just described process steps for forming the described openings and layers are conventional.

If the workpiece is exposed to oxygen after the openings 16 are formed, the exposed surface of each contact area 17 generally will oxidize to form a thin layer of "native oxide" 18. Such oxygen exposure may occur in an "ashing" process for removing photoresist after etching the openings in the dielectric, or it may occur if the workpiece is exposed to ambient atmosphere while it is transported between two process chambers. This native oxide must be removed or "cleaned" before depositing the metal plug in order to achieve good electrical contact between the plug and the contact area.

In our invention, the contact area is cleaned by a process that includes at least two steps. In one step, the native oxide 18 is removed by exposing the substrate to a first atmosphere formed by plasma decomposition of at least one fluorine-containing gas (FIG. 2, Step 101). We have discovered that this step can leave fluorine residue in the contact openings 16 that can impair the performance, such as electrical resistivity, of a subsequently deposited plug. Therefore, our invention further includes a subsequent step of exposing the substrate to a second atmosphere that scavenges fluorine (Step 102). By "scavenge", we mean that the second atmosphere contains species that combine with fluorine to form volatile compounds. Such volatile compounds are evacuated from the process chamber by the exhaust pump connected to exhaust port 30, thereby eliminating fluorine residue from the contact or via openings 16.

The fluorine-containing plasma used in our first step (Step 101) can be produced by supplying to a conventional plasma chamber one or more fluorine-containing gases such as $NF_3$, $C_2F_6$, or $SF_6$. Optionally, a carrier gas such as helium can be supplied to the plasma chamber. An electromagnetic power source excites the gases to a plasma state so as to dissociate many of the gas molecules. The carrier gas is desirable to enhance dissociation of the fluorine-containing gas. As described below, we successfully cleaned native oxide from a silicon region using a gas supply of 10% $NF_3$ and 90% He.

(Throughout this patent specification, the percentage concentration of each constituent gas in a gas mixture is expressed as a percentage according to molecular molar concentration, which approximately equals the percentage concentration according to volume. We use the term "gas mixture" to refer to one or more gases supplied to a plasma chamber; the term "mixture" does not imply that more than one type of gas species is included.)

To avoid sputtering damage to the substrate, it is preferable to form the plasma by a method that minimizes electric fields at the workpiece position.

One suitable method of forming the plasma is in a conventional remote plasma source, which means that the plasma either is formed in a separate chamber from the vacuum chamber that holds the workpiece, or else the plasma is formed in a separate region of a common chamber such that the plasma body is a substantial distance from the workpiece. In either case, an exhaust pump causes radicals and ions produced by decomposition of gases in the plasma to flow from the plasma body to the workpiece. Conventional process chambers having remote plasma sources are described in commonly-assigned U.S. Pat. No. 5,346,579 to Cook et al. and U.S. Pat. No. 5,543,688 to Morita, the entire content of each of which is hereby incorporated by reference into this patent specification.

Alternatively, our currently preferred method of forming the plasma so as to avoid sputtering damage to the workpiece is in a plasma chamber having an inductively coupled plasma source, such as the commercially available preclean chamber 20 shown in FIG. 3.

The upper portion of the chamber is bounded by an upper wall 22 composed of dielectric material, and the lower portion of the chamber is bounded by a lower wall 23 composed of either dielectric or conducting material, typically aluminum. All surfaces of the susceptor that are exposed to chamber gases—i.e., all surfaces not covered by the substrate—are covered by a dielectric 37. The dielectric material used for the upper wall 22 and the susceptor liner 37 preferably should be resistant to etching by the fluorine-containing species used in the process. A suitable dielectric material is alumina ceramic.

The fluorine-containing gas mixture described above flows from a gas supply tank 24 at a flow rate regulated by a flow controller 26, typically a mass flow controller, and then is injected into the upper portion of the chamber through one or more gas inlet ports 28. An exhaust pump, not shown, exhausts chamber gases Through exhaust port 30 and regulates the chamber pressure. An RF power supply 32 supplies RF electrical power to an induction coil 34 that encircles the dielectric upper chamber wall 22. The electrical power is inductively coupled from the coil to the gases in the upper portion of the chamber so as to excite the gases to a plasma state.

The substrate 10 is mounted in the lower portion of the chamber on a pedestal or susceptor 36, typically composed of aluminum. Preferably a second RF power supply 38, also called a bias power supply, is connected to supply RF power to the susceptor. This will create a negative DC bias voltage on the susceptor that will increase the flow of ions from the plasma to the susceptor. However, in some applications the desired cleaning rate may be achieved by diffusion of fluorine-containing radicals and ions from the plasma to the substrate without a negative bias voltage. In such cases the bias power supply 38 could be omitted. All of the chamber hardware components described above are conventional.

Various dissociated fluorine-containing species, such as $NF_x$ and F radicals and ions, travel from the plasma to the substrate. These fluorine-containing species react with the native oxide 18 to form volatile compounds such as $SiF_4$ that are exhausted from the chamber by the exhaust pump, thereby removing the native oxide 18 from the surface of the contact areas 17 of the semiconductor or metal region 12.

After the native oxide 18 is completely removed, the flow controller 26 shuts off the supply of the fluorine-containing gas to the chamber. Our invention then supplies a second atmosphere to the chamber to remove or "scavenge" fluorine residue from the contact or via openings 16. This scavenging step preferably is performed in the same plasma chamber used to perform the fluorine cleaning step.

By "scavenge", we mean that the second atmosphere contains species that combine with fluorine to form compounds that are volatile. By "volatile" we mean compounds that vaporize at the temperature and pressure of the atmosphere within the chamber. Such volatile compounds are evacuated from the process chamber by the exhaust pump connected to exhaust port 30, thereby eliminating fluorine residue from the contact or via openings 16.

The second atmosphere preferably is formed by plasma decomposition of at least one hydrogen-containing gas. Hydrogen radicals and ions scavenge fluorine by forming volatile compounds such as HF. Our preferred hydrogen-containing gas is $H_2$ (hydrogen gas), but $NH_3$ (ammnonia) and $SiH_4$ (silane) are acceptable alternatives.

The hydrogen gas typically is mixed with a carrier gas such as helium. Although higher percentages of hydrogen can be used, a preferred mixture is 5% $H_2$ and 95% He because higher concentrations of hydrogen are flammable and therefore require additional safety precautions.

In both the fluorine plasma cleaning step (FIG. 2, Step 101) and the hydrogen plasma scavenging step (Step 102), the preferred carrier gas is helium because helium ions are very light and therefore will subject the dielectric 14 to little or no sputtering damage. This is important for those types of dielectrics that are especially susceptible to damage, such as those composed of organic materials. Carrier gases composed of atomic species having a greater atomic mass, such as argon, could be used instead of helium in applications in which the dielectric is not susceptible to sputtering damage. However, one advantage of our process is that it does not require sputtering, hence it does not require a carrier gas having atomic species heavier than helium.

The second atmosphere (preferably from a hydrogen-containing plasma) is maintained as long as necessary to remove all fluorine residue from the contact or via openings 16. We find that one minute is sufficient.

The hydrogen-helium gas mixture is supplied by a second gas supply tank 40 at a flow rate regulated by a second flow controller 42, and then is injected into the upper portion of the chamber through the previously described gas inlet ports 28. A master controller 44, preferably a conventional programmable controller such as a microcomputer, preferably controls the flow rates of the two flow controllers 26, 42, the power output levels of the two RF power supplies, and a throttle valve (not shown) that regulates the chamber pressure. The master controller preferably is programmed to permit a human operator to adjust all of these and other process parameters discussed in this patent specification.

Next the substrate is transferred to a conventional metal deposition chamber so that a metal 50 (FIG. 4) can be deposited in the openings 16 (FIG. 1) so as to make electrical contact with the exposed contact areas 17 of the semiconductor or metal regions 12. If the regions 12 are metal, it may be possible to simply fill each plug or via opening 16 with a desired metal 50 such as aluminum, tungsten, or copper (FIG. 2, Step 106) without any intermediate steps (Steps 103–105).

Optionally, before depositing the metal 50 to fill the opening 16, a conventional additional step (FIG. 2, Step 105) is to deposit on the side walls of the opening a wetting or adhesion layer 52 (FIG. 4) that prevents the formation of voids in the plug that could be created if the metal 50 pulls away from the side wall of the dielectric 14 while it is filling the opening 16. The wetting layer typically is composed of titanium or a titanium-containing compound or alloy such as titanium nitride or titanium-tungsten alloy. Processes for depositing wetting layers are described in commonly-assigned U.S. Pat. No. 5,371,042 to Ong; U.S. Pat. No. 5,443,995 to Nulman; and U.S. Pat. No. 5,911,113 to Yao; the entire content of each of which is hereby incorporated by reference into this patent specification.

If the regions 12 are silicon or other semiconductor, in order to prevent diffusion of the metal 50 into the semiconductor, it often is necessary to deposit a "diffusion barrier layer" 54 over the semiconductor 12 (FIG. 2, Step 103) before depositing the plug metal 50 (Step 106). The barrier layer usually is titanium nitride. The barrier layer often is annealed (Step 104) in order to minimize the porosity of the barrier film.

Also, in order to achieve good electrical contact between the semiconductor material 12 and the metal 50 that fills the remainder of the opening, it often is necessary to form directly over the semiconductor region 12 a "contact layer" 56 composed of a compound of the semiconductor material and a refractory metal. In the case of silicon, the compound would be a refractory metal silicide. In silicon wafer manufacturing, the refractory metal silicide layer 52 conventionally is formed by depositing over the silicon contact area a layer of a refractory metal such as titanium, molybdenum or tungsten (FIG. 2, Step 103), and then annealing the substrate (Step 104) at a temperature high enough to cause silicon atoms from the silicon region 12 to diffuse into the refractory metal to form a thin layer of refractory metal silicide.

Processes for depositing titanium silicide layers are described in U.S. Pat. No. 5,525,543 to Chen and in commonly-assigned U.S. Pat. No. 5,378,660 to Ngan, the entire content of each of which is hereby incorporated by reference into this patent specification. Processes for depositing diffusion barriers are described in the above-referenced patents to Ong, Nulman, and Ngan, respectively, and in commonly-assigned U.S. Pat. No. 5,108,569 to Gilboa, the entire content of which is hereby incorporated by reference into this patent specification. The Ngan patent describes a process for annealing a layer of titanium in a nitrogen atmosphere so as to simultaneously form a titanium silicide contact layer where the titanium contacts the underlying silicon and a titanium nitride barrier layer where the upper surface of the titanium is exposed to nitrogen.

FIG. 4 shows the contact layer 56 and the barrier layer 54 on the bottom of the opening 16 but not on the side walls. Conversely, FIG. 4 shows the wetting layer 52 on the side walls but not on the bottom of the opening. In practice, some of the contact layer and barrier layer material unavoidably will be deposited on the side walls, and some of the wetting layer material will be deposited on the bottom of the opening. In fact, some materials such as titanium nitride can function as both the barrier layer 54 and as the wetting layer 52 if deposited on both the bottom and sides of the opening.

A serious shortcoming of conventional processes for forming a refractory metal silicide is that a very high annealing temperature (Step 104) may be required to achieve an electrical contact between the metal plug 52 and the silicon region 12 having a sufficiently low electrical resistance. We have discovered that our precleaning process—in which a hydrogen plasma (Step 102) scavenges fluorine residue from a preceding fluorine plasma cleaning step (Step 101)—reduces the annealing temperature required to reduce the electrical resistance to a desired value (Step 104). The advantages of our invention over conventional processes that lack the hydrogen plasma scavenging step (Step 102) are demonstrated by the example below.

Our cleaning process (Steps 101 and 102) and subsequent metal deposition and annealing processes (Steps 103–106) preferably are performed in a conventional integrated, multi-chamber processing system so that the substrate can be transferred from one process chamber to another while remaining in a contaminant-free vacuum environment. FIG. 5 shows a suitable multi-chamber system that is commercially available from the assignee of the present invention. A central controller or microcomputer 44 controls all components of the system. As described earlier, the cleaning process (Steps 101 and 102) is performed in a conventional preclean chamber 20, with the gas flow rates and other process parameters being controlled by the controller 44. The controller then commands robot 60 to transfer the substrate from the preclean chamber to a metal deposition chamber, such as a sputter deposition chamber 62. The contact metal layer 56 and/or the barrier layer 54 are deposited in that chamber under process parameters regulated by the controller 44 (Step 103). The controller then commands robots 60 and 64 to transfer the substrate to a high temperature anneal chamber 66, where the controller holds the substrate for a desired anneal time and temperature (Step 104). The controller then commands robots 60 and 64 to transfer the substrate back to the same metal deposition chamber 62 or to another metal deposition chamber 68 for deposition of the wetting layer (Step 105) and for deposition of the metal 50 that fills the remainder of the plug or via (Step 106). Finally, the controller commands the robots 60 and 64 to transfer the substrate to a load lock chamber 70 from which the substrate can be transferred out of the vacuum system to an external storage cassette.

EXAMPLE

We compared our cleaning process with three other cleaning processes in the exemplary application of cleaning a silicon film before depositing titanium over the silicon. We judged the effectiveness of each cleaning process by measuring the sheet resistance between the titanium and silicon films after the substrate was annealed to form titanium silicide at the boundary between the titanium and the silicon.

To simplify the resistance measurements, we did not deposit any dielectric on the substrates. Instead, we simply used bare silicon wafers that were exposed to ambient atmosphere so as to develop an outer layer of native oxide. After performing one of the four cleaning processes in an attempt to remove the native oxide, we deposited a 150 Å layer of titanium over the substrate using a conventional sputter deposition process. We then annealed the substrate for 20 seconds to promote diffusion of silicon atoms into the titanium to form titanium silicide. Different substrates were annealed at temperatures of 600° C. and 675° C. for comparison. Finally we measured the sheet resistance, in ohms per square, between the titanium film and the silicon substrate. Our test results are shown in Table 1.

In Table 1, the entry "HF wet dip" represents a process of submerging the substrate in liquid hydrofluoric acid. Although wet cleaning is undesirable because it exposes the substrate to contamination from the ambient atmosphere, HF wet cleaning is considered a reference to which other cleaning methods are compared.

In Table 1, the entry "$NF_3$" represents a plasma cleaning process performed in the chamber shown in FIG. 3, using a gas supply of 10% $NF_3$ and 90% He, at a flow rate of 50 sccm. The chamber pressure was 50 mT, the RF power to the induction coil was 300 watts at a frequency of 2 MHz, and the RF power to the susceptor (bias power) was 300 watts at a frequency of 13.56 MHz. The process was performed for 60 seconds.

The entry "Ar sputter" represents an argon sputter cleaning process to remove fluorine residue remaining from the $NF_3$/He plasma cleaning process. Argon gas was supplied to a plasma chamber at a flow rate of 5 sccm. The chamber pressure was 0.6 mT; the RF power to the induction coil and to the susceptor was 100 watts each at 2 MHz and 13.56 MHz, respectively; and the process was performed for 60 seconds.

The entry "$H_2$" represents our hydrogen-containing plasma process for scavenging fluorine residue remaining from the $NF_3$/He plasma cleaning process. Using the chamber shown in FIG. 3, the gas supply was 5% $H_2$ and 95% He at a flow rate of 100 sccm. The chamber pressure was 80 mT; the RF power to the induction coil and to the susceptor was 300 watts each at 2 MHz and 13.56 MHz, respectively; and the process was performed for 60 seconds.

TABLE 1

Sheet Resistance After Different Cleaning Methods and Anneal Temperatures

| Cleaning Method | 600° C. Anneal | 675° C. Anneal |
| --- | --- | --- |
| 1. $NF_3$ then H2 (Our Invention) | 33 | 20 |
| 2. None | 101 | 34 |
| 3. $NF_3$ only | 123 | 31 |
| 4. $NF_3$ then Ar sputter | 91 | 19.5 |
| 5. HF Wet Dip | 37 | 30 |

The worst results (highest sheet resistance) were produced when the native oxide was not cleaned at all and when the native oxide was cleaned only with the $NF_3$ plasma step, without any subsequent step to remove fluorine residue. When the annealing was performed at 675° C., the results were equally good with either argon sputtering or hydrogen plasma scavenging after the $NF_3$ plasma cleaning. However, when the annealing was performed at 600° C., the process of our invention, using hydrogen plasma to scavenge fluorine residue, resulted in a sheet resistance (33 ohms/square) almost three times better than the argon sputtering process to remove the fluorine residue. Furthermore, our process resulted in a sheet resistance after 600° C. annealing that was almost as good as the resistance after 675° C. annealing.

These test results show that our process has at least three advantages over the other processes tested. One advantage is that our process reduces the electrical resistance between the refractory metal and the underlying semiconductor.

A second advantage is that our process enables the annealing to be performed at a lower temperature with only a minor sacrifice in resistance of the contact. In many applications, the ability to reduce the annealing temperature is valuable to minimize diffusion of metal atoms into the dielectric side walls of the contact.

A third advantage is that our process achieves electrical resistance as low or lower than argon sputtering, thereby eliminating the need to subject the dielectric to the risk of damage due to sputtering by heaving atoms such as argon. In fact, to avoid such sputtering damage to the dielectric, we prefer that the gas mixtures used on our process exclude $BCl_3$, argon, and any compound of any element having an atomic mass greater than the atomic mass of argon.

What is claimed is:

1. A method of cleaning a contact area of a metal or semiconductor region on a semiconductor workpiece, comprising the steps of:

providing a semiconductor workpiece that includes at least one region of metal or semiconductor material having an exposed contact area;

exposing the semiconductor workpiece to a first atmosphere produced by plasma decomposition of a first gas mixture that includes a fluorine-containing gas and an inert gas having an atomic mass less than the atomic mass of argon; and subsequent to the step of exposing the semiconductor workpiece to the first atmosphere, exposing the semiconductor workpiece to a second atmosphere produced by plasma decomposition of a second gas mixture that scavenges fluorine, wherein the second gas mixture includes helium and a hydrogen-containing gas.

2. A method according to claim 1, wherein:

the step of exposing the semiconductor workpiece to the second atmosphere is continued long enough to remove substantially all fluorine from said contact area.

3. A method according to claim 1, wherein the hydrogen-containing gas is $H_2$.

4. A method according to claim 1, wherein the second gas mixture consists essentially of $H_2$ and helium gas.

5. A method according to claim 1, wherein:

the step of exposing the semiconductor workpiece to the first atmosphere is continued long enough to remove substantially all native oxide from said contact area.

6. A method according to claim 1, wherein the first gas mixture includes at least one gas selected from $NF_3$, $C_2F_6$, and $SF_6$.

7. A method according to claim 1, wherein titanium is deposited over the cleaned contact area.

8. A method according to claim 1, wherein the metal or semiconductor material is silicon.

9. A method of depositing a metal over a contact area of a semiconductor region on a workpiece, comprising the steps of:

providing a workpiece that includes at least one region of semiconductor material having an exposed contact area;

exposing the workpiece to a first atmosphere produced by plasma decomposition of a first gas mixture that includes a fluorine-containing gas and an inert gas having an atomic mass less than the atomic mass of argon;

subsequent to the step of exposing the workpiece to the first atmosphere, exposing the workpiece to a second atmosphere produced by plasma decomposition of a second gas mixture that scavenges fluorine, wherein the second gas mixture includes helium and a hydrogen-containing gas; and depositing said metal over the contact area.

10. A method according to claim 9, further comprising the step of:

annealing the substrate at a temperature and duration sufficient to interdiffuse atoms of the semiconductor material and the metal;

wherein the metal is a refractory metal.

11. A method according to claim 10, wherein said temperature is less than 675° C.

12. A method according to claim 10, wherein said temperature is less than or equal to 600° C.

13. A method according to claim 9, wherein the metal is titanium.

14. A method according to claim 9, wherein the semiconductor material is silicon.

15. A method according to claim 9, wherein:

the step of exposing the workpiece to the second atmosphere is continued long enough to remove substantially all fluorine from said contact area.

16. A method according to claim 9, wherein the hydrogen-containing gas is $H_2$.

17. A method according to claim 9, wherein the second gas mixture consists essentially of $H_2$ and helium gas.

18. A method according to claim 9, wherein:

the step of exposing the workpiece to the first atmosphere is continued long enough to remove substantially all native oxide from said contact area.

19. A method according to claim 9, wherein the first gas mixture includes at least one gas selected from $NF_3$, $C_2F_6$ and $SF_6$.

20. A method according to claim 9, wherein the first gas mixture further includes helium.

* * * * *

UNITED STATES PATENT AND TRADEMARK OFFICE
CERTIFICATE OF CORRECTION

PATENT NO. : 6,313,042 B1
DATED : November 6, 2001
INVENTOR(S) : Cohen et al.

It is certified that error appears in the above-identified patent and that said Letters Patent is hereby corrected as shown below:

Column 4,
Line 6, please replace "Through" with -- through --.

Column 7,
Line 64, please replace "H2" with -- $H_2$ --.

Signed and Sealed this

Twenty-first Day of May, 2002

Attest:

Attesting Officer

JAMES E. ROGAN
Director of the United States Patent and Trademark Office